US012808922B2

(12) United States Patent
Knierim

(10) Patent No.: US 12,808,922 B2
(45) Date of Patent: Nov. 24, 2026

(54) SYSTEM AND METHODS TO ACCURATELY MEASURE DYNAMIC RESISTANCE FOR POWER DEVICES

(71) Applicant: Tektronix, Inc., Beaverton, OR (US)

(72) Inventor: Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 80 days.

(21) Appl. No.: 18/641,314

(22) Filed: Apr. 19, 2024

(65) Prior Publication Data

US 2024/0353470 A1 Oct. 24, 2024

Related U.S. Application Data

(60) Provisional application No. 63/607,025, filed on Dec. 6, 2023.

(30) Foreign Application Priority Data

Apr. 20, 2023 (IN) ............................ 202321028782
Jun. 29, 2023 (IN) ............................ 202321043710
Sep. 28, 2023 (IN) ............................ 202321065294

(51) Int. Cl.
*G01R 31/26* (2020.01)

(52) U.S. Cl.
CPC ................................ *G01R 31/2621* (2013.01)

(58) Field of Classification Search
None
See application file for complete search history.

(56) References Cited

U.S. PATENT DOCUMENTS 4,833,403 A * 5/1989 Tamamura ......... G01R 29/0276 324/130
6,654,916 B1 11/2003 Furukawa
(Continued)

FOREIGN PATENT DOCUMENTS

JP 2003035680 2/2003
KR 1020220033143 3/2022

OTHER PUBLICATIONS

Korean Intellectual Property Office, International Search Report and Written Opinion for International Application No. PCT/US2024/025592, Aug. 5, 2024, 9 pages, Daejeon, Republic of Korea.

*Primary Examiner* — Jas A Sanghera
(74) *Attorney, Agent, or Firm* — Miller Nash LLP; Andrew J. Harrington

(57) ABSTRACT

A test and measurement system includes a device under test (DUT) interface structured to couple to at least one DUT and a measurement instrument coupled to the interface. The instrument includes one or more processors configured to, when testing the DUT, accept a measurement signal at a first input channel and generate a first sample waveform from the measurement signal using a first set of parameters, accept the measurement signal at a second input channel and generate a second sample from the measurement signal using a second set of parameters, and generate a measurement waveform from a combination of the first sample waveform and the second sample waveform. Additionally, the measurement instrument is structured to determine settling errors in the first pulse of a double-pulse test, and then compensate measurements made in subsequent pulses for the settling errors.

6 Claims, 12 Drawing Sheets

(56) References Cited

U.S. PATENT DOCUMENTS

| | | | | |
|---|---|---|---|---|
| 10,640,003 | B2 | 5/2020 | Lu et al. | |
| 10,782,334 | B2 | 9/2020 | Asam | |
| 11,262,399 | B2 | 3/2022 | Miyazato | |
| 11,474,145 | B2 | 10/2022 | Ugur et al. | |
| 11,747,390 | B2 | 9/2023 | Yang et al. | |
| 2002/0135357 | A1 | 9/2002 | Maassen et al. | |
| 2008/0309355 | A1* | 12/2008 | Nozaki .............. | G01R 31/2621 324/754.01 |
| 2016/0334466 | A1 | 11/2016 | Rivoir | |
| 2022/0291278 | A1* | 9/2022 | Sobolewski ....... | G01R 31/2601 |

* cited by examiner

600

602

SYSTEM AND METHODS TO ACCURATELY MEASURE DYNAMIC RESISTANCE FOR POWER DEVICES

RELATED APPLICATIONS

This disclosure claims priority under 35 U.S.C. § 119 to Indian Provisional Patent Application No. 202321028782, titled "SOFTWARE APPROACH OF RDS (ON) MEASUREMENT FOR WIDE BANDGAP SEMICONDUCTOR DEVICES," filed on Apr. 20, 2023, Indian Provisional Patent Application No. 202321043710, titled "A METHOD TO COMPUTE DYNAMIC ON RESISTANCE FOR POWER DEVICES," filed on Jun. 29, 2023, and Indian Provisional Patent Application No. 202321065294, titled "A METHOD TO COMPUTE DYNAMIC ON RESISTANCE FOR POWER DEVICES," filed on Sep. 28, 2023. This disclosure is also a non-provisional of and claims benefit from U.S. Provisional Application No. 63/607,025, titled "DOUBLE-PULSE METHOD FOR MEASURING DYNAMIC ON RESISTANCE OF POWER SEMICONDUCTOR DEVICES," filed on Dec. 6, 2023, the disclosures of all of which are incorporated herein by reference in their entireties.

TECHNICAL FIELD

This disclosure relates to test and measurement systems, and, more particularly, to techniques in dynamic characterization of power semiconductor devices.

BACKGROUND

Wide bandgap semiconductors offer advantages over conventional bandgap semiconductor materials for making high-voltage, high-speed, high-power, and high-frequency electronic devices. Measuring electrical properties of and characterizing devices made from wide bandgap materials is more difficult, in some ways, than measuring those made from conventional materials. For instance, wide bandgap transistors may have ON-state voltages on the order of a few volts, while OFF-state voltages can exceed hundreds or thousands of volts. Such large disparities may cause wide bandgap transistors to exhibit a shift in ON-state channel resistance over time, caused by charge trapping near the gate due to the high drain-gate electric fields during the OFF state. Gate drive energy may be reduced during the next subsequent ON-state until the trapped charge has dissipated. The dissipation occurs too quickly to be accurately measured with conventional static resistance measuring techniques, but slowly enough to impact the average conduction losses of the device being tested in the 100 KHz-1 MHz frequency range. Thus, at least one of the frequently made measurements for characterizing wide bandgap power devices, the dynamic ON resistance, Rds(on), is typically measured with a time-domain instrument such as an oscilloscope using circuit probes and a test fixture. Probe settling errors and/or oscilloscope channel settling errors significantly limit the ability to accurately measure Vds(on), which is a precursor in measuring Rds(on), because of the large disparity in ON and OFF voltages found in power devices, as described above. For example, the OFF voltage Vds(off) may be on the order of 800 Volts in a modern electric vehicle charger or motor drive, but the ON voltage Vds(on) may be on the order of 2-4 volts. To measure the dynamic Rds(on) effect to within 10% accuracy, an accuracy of 0.2 Volts would be required, which represents a dynamic range of 800 V/0.2 V, or 4000:1, which is beyond the dynamic range of many conventional oscilloscopes. A conventional solution to reducing the dynamic range enough to accurately measure Rds(on) is to add a voltage clamping circuit, or clamp circuit, in hardware, between the device being tested and a voltage probe of the measuring instrument to limit the Vds signal to a voltage low enough to observe the Vds(on) voltage, but much smaller than the Vds(off) voltage. For example, a clamp circuit set at a clamp voltage of 5 Volts would limit the dynamic range to approximately 5V/0.2 V=25:1, which may be readily achieved. Although the hardware clamp circuit may help with the dynamic range problem, using hardware clamps increases the cost of the testing setup and introduces a possibility of parasitic elements to the circuit being tested such as RC (resistive-capacitive) decay, and voltage offset, either of which can negatively affect the accuracy of the measurement. Further, using a hardware clamp typically requires extra time and effort to properly couple the clamp to the power device being tested, and also requires that the clamp be impedance matched to the testing board, introducing testing design delay.

In addition to the dynamic range issues described above, there are other issues preventing accurate measurement of dynamic characteristics of power devices in conventional testing setups. For example, high operating voltages of the acquisition system may cause an overdrive situation that can lead to incorrect values being acquired during testing, which decreases measurement accuracy. Also, some types of wide bandgap materials, such as Gallium nitride (GaN) materials, experience a current collapse during some testing conditions, which reduces the DC drain currents in transistors based on GaN. Since Rds(on) is typically determined by using a drain current measurement, this current collapse may lead to inconsistencies in the Rds(on) measurement of these devices. Further, power devices may experience overheating during testing, due to increasing resistance values, which also contributes to inaccurate measurement of power devices. Thus, there is a need in the industry for new techniques to measure and characterize power devices with greater accuracy than is presently available with conventional testing devices and methods.

DETAILED DESCRIPTION

Embodiments according to the disclosure are used to measure, test, and/or characterize power semiconductor devices, such as wide bandgap devices. Such devices may be formed from Silicon (Si), Silicon Carbide (SiC) or Gallium Nitride (GaN), although other materials may also be used, and embodiments are not limited to devices made only from these materials. As mentioned above, testing power semiconductor devices with an oscilloscope or other measurement instruments involves challenges due to the much higher voltages and currents of these wide bandgap power devices relative to standard bandgap devices, such as devices made from Silicon (Si), Germanium (Ge), or Gallium arsenide (GaAs). Although the power devices may experience high operating or OFF-state voltages, their ON-state voltages may be on the order of a few volts. Thus, any instrument attempting to accurately measure both the operating and stand-by conditions of power devices faces challenges of limited dynamic range and its related problem of quantization error. Embodiments according to the disclosure use a variety of techniques that may be combined or operate independently of one another to reduce errors associated with characterizing power devices.

Figure 1:
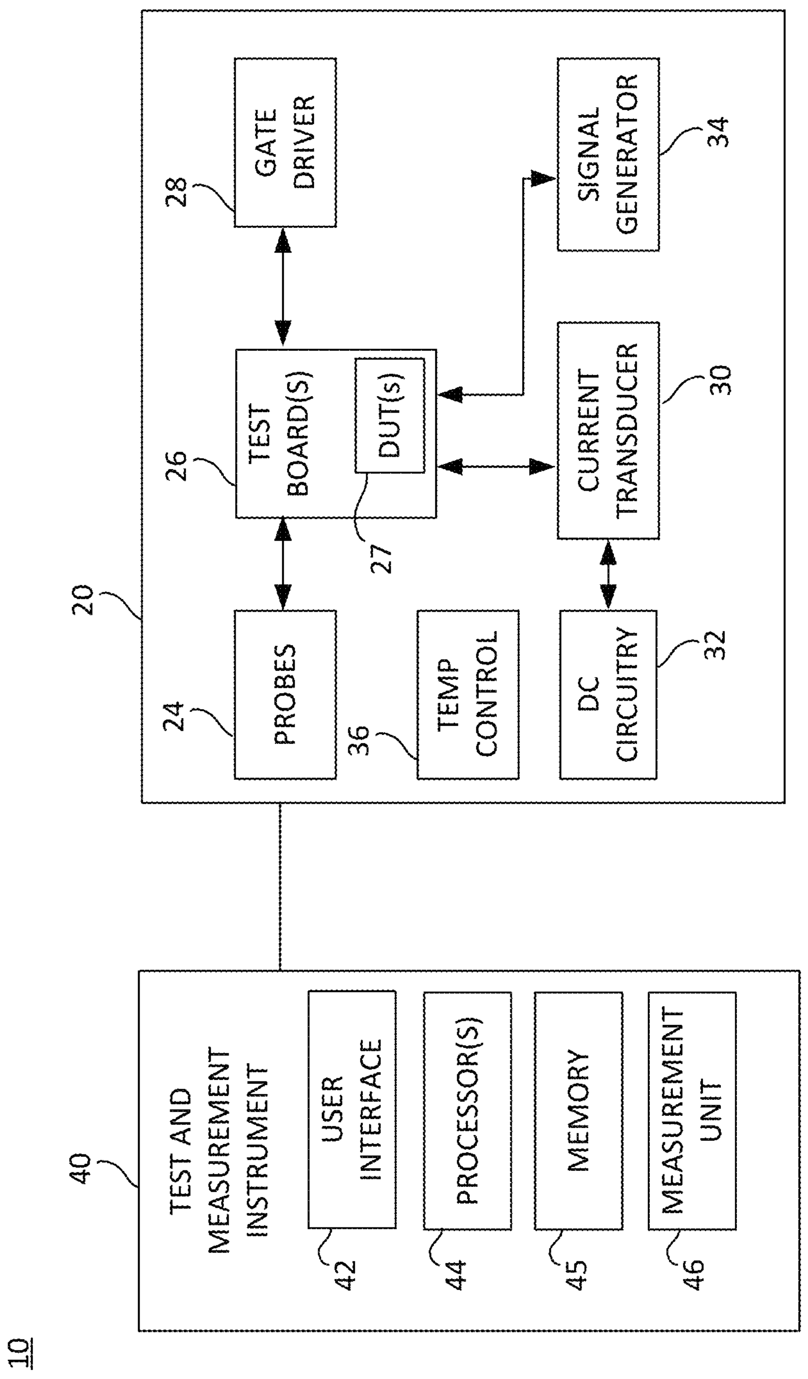
FIG. 1 is a block schematic diagram illustrating a testing system that includes a DUT fixture or testing platform as well as a test and measurement instrument that accurately performs measurements on electronic devices according to embodiments of the disclosure.

Performing power characterization of one or more Devices Under Test (DUTs) generally involves a test and measurement instrument, such as an oscilloscope, as well as a separate testing platform for operating the DUTs during testing. FIG. 1 illustrates a testing system 10 that includes a DUT testing platform 20 as well as a test and measurement instrument 40. The testing system 10 may include some or all of the components shown in FIG. 1.

The DUT testing platform 20 is structured to hold and operate one or more DUTs 27 while being tested by the instrument 40. The testing platform 20 includes one or more test boards 26 that support the one or more DUTs 27 being tested. The DUTs 27 are coupled to the instrument 40 through one or more measurement probes 24 in a known manner for testing various voltages and currents of the DUTs during different portions of the testing process. The test boards 26 may be coupled to a gate driver 28, which is generally used to turn one or both of the DUTs 27 ON and OFF at desired time intervals with stability, and possibly provide power protection to the DUTs as well. DC circuitry 32 may include DC-link capacitances, a DC voltage supply, and load inductors. A current transducer 30 and a signal generator 34 connect to the test boards 26 to allow the DUTs 27 to be tested. Operation of the DC Circuitry 32 as well as the operation of the DUTs 27 may generate heat, and/or the DUTs may need a particular temperature range to operate for testing. The power testing platform 20 accordingly may include temperature control circuitry 36 to control the temperature of the DUTs 27.

The measurement instrument 40 may have many different components, including a user interface 42 that allows a user to interact with various menus. The user interface 42 provides an interface for the user to make selections as to the tests to be run, set parameters, etc., such as through a display having a touch screen or various buttons and knobs. Although illustrated in FIG. 1 as a component of the measurement instrument 40, the user interface 42 may be a separate device, such as a personal computer or other computing device separate from the instrument. The user interface 42 may also accept commands at the measurement instrument that are received from a controlling instrument coupled to the measurement instrument through, for example, the internet.

The measurement instrument 40 has one or more processors 44 that generally control the operation of the measurement device and causes it to perform the requested tests of the DUTs 27. The term "processor" as used here means any electronic component that can receive an instruction and perform an action, such as microcontrollers, field programmable gate arrays (FPGA), and application-specific integrated circuits (ASIC), as will be discussed in more detail below. The one or more processors 44 communicate with memory 45 which may store operations, such as programs and subroutines, as well as data gathered by the measurement instrument 40 during operation. The memory 45 is illustrated as a single memory in FIG. 1 for convenience, but in practicality the measurement instrument 40 includes many memories distributed throughout the instrument for various storage purposes. A measurement unit 46 performs tests and measures parameters of a DUTs 27 coupled to the measurement instrument 40, typically through one or more probes 24, which may be voltage and/or current probes, for example. One such test described herein is referred to as a double-pulse test (DPT), in which the one or more DUTs 27 receive pulses from the gate driver 28 in a particular pattern to cause the DUTs to cause a circuit to which the DUTs 27 are connected to operate in a particular manner to facilitate the testing. Although the test is referred to as a double-pulse test, the test procedure may include, and often does include multiple pulses at various times to control the one or more DUTs 27. Additionally, the double-pulse test or other various tests on the DUTs performed by the measurement instrument may be repeated depending on the particular tests being performed and the reasons for such tests. Some tests may include thousands or millions of separate operations, while some tests may be performed with very few operations.

Figure 2:
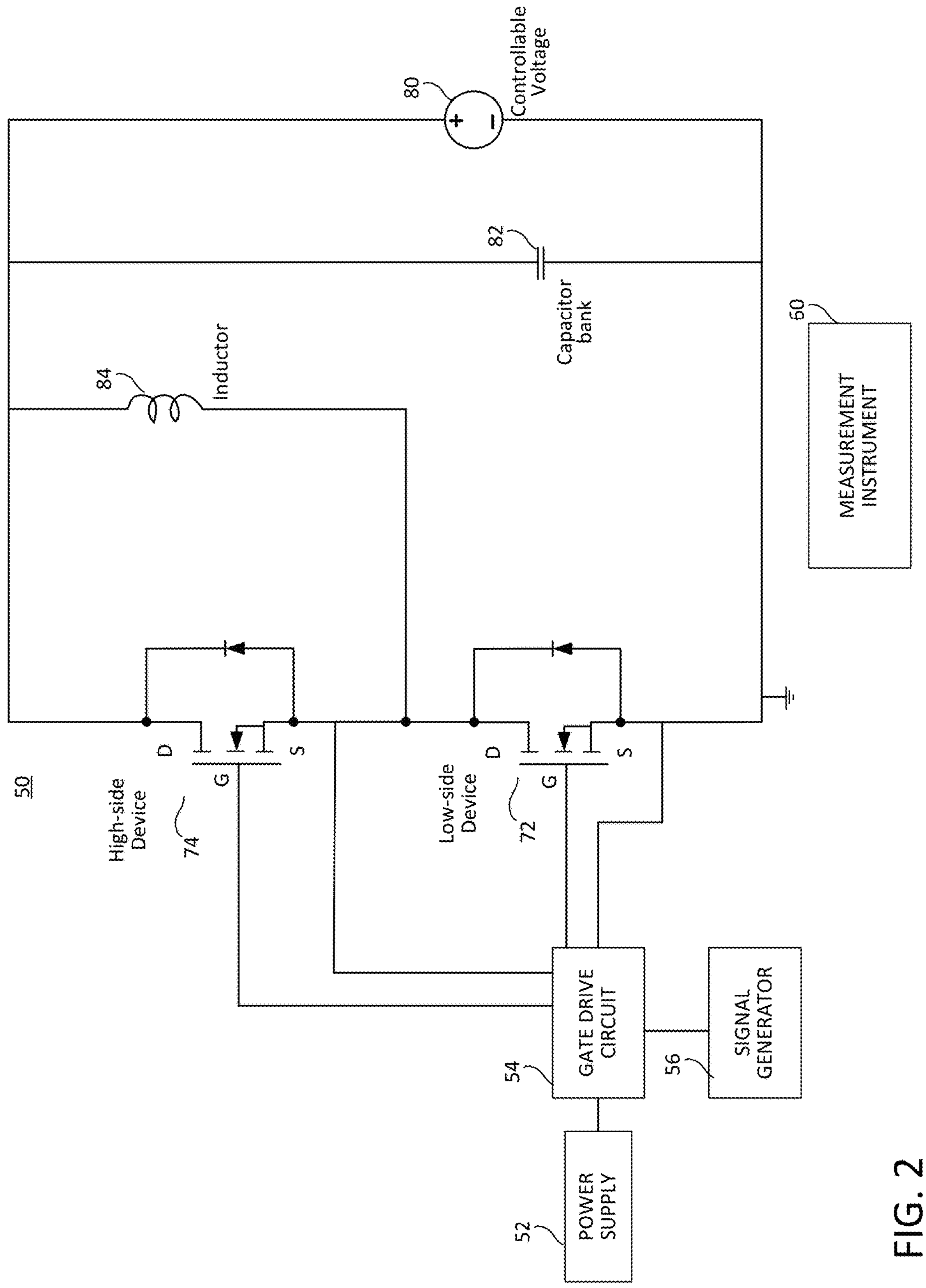
FIG. 2 is a partial schematic diagram of the testing system according to FIG. 1 illustrating particular connections thereof.

FIG. 2 illustrates a testing system 50 that includes many of the same components as the testing system 10 described with reference to FIG. 1 but illustrates them in a manner to facilitate description of the various tests performed on the DUTs. The testing system 50 includes a power supply 52 coupled, along with a signal generator 56 to a gate drive circuit 54 that is used to drive the gates or other terminals of a low-side DUT 72 and high-side DUT 74. In FIG. 2 the DUTs 72, 74 are illustrated as power Metal-Oxide-Semiconductor-Field-Effect Transistor devices (power MOSFETs), but embodiments are not limited to such devices, and may be used to test MOSFETs, Insulated Gate Bipolar Transistors (IGBTs), or diodes, for example. In some configurations the high-side DUT 74 may be diode-connected, with its gate tied to its source. Other configurations for testing may appear differently than illustrated in FIG. 2. A measurement instrument 60 may be an embodiment of the measurement instrument 40 described above with reference to FIG. 1. The measurement instrument 60 is coupled to particular nodes or components of the circuitry illustrated in FIG. 2 in a known manner to detect and measure various voltages and currents during different phases of the operation of the DUTs 72, 74, as will be described in detail below. Circuitry coupled to the DUTs 72 includes a controllable voltage supply 80, capacitor bank 82, and inductor 84 that operate to control the operation of the DUTs. These circuit components may be driven by components of the DUT testing platform 20 described with reference to FIG. 1 above.

Generally, in operation, the user supplies an input through the user interface 42 (FIG. 1), remotely or directly, to control operation of the testing platform 20 to characterize the DUTs 72, 74. Dynamic characterization is generally accomplished using a half bridge circuit as illustrated in FIG. 2. The half bridge circuit is formed by the high-side device DUT 74 and the low-side device DUT 72, which correspond to the DUTs 27 illustrated in the testing system 10 of FIG. 1. In the illustrated half bridge circuit, the high-side device DUT 74 and low-side device DUT 72 are coupled in series between a supply voltage node and reference voltage node. In general operation, the low-side device DUT 72 is turned ON to cause a desired current to flow from the voltage supply 80, through a test inductor 84, and through the low-side device DUT 72 to a reference voltage. Subsequently, the low-side device DUT 72 is turned OFF and then the high-side device DUT 74 is turned ON. This action first initiates and then circulates inductor current from the inductor 84 through the high-side device DUT 74. Alternatively, the high-side device DUT 74 may be replaced by a diode if only one DUTs 27 is being tested. After a specified time that depends upon characteristics of the high-side and low-side DUTs 72, 74, the high-side device DUT 74 is turned OFF, and the low-side device DUT 72 is again turned ON. Desired data to test and characterize the DUTs 72, 74 may be collected during these transitions by the measurement instrument 60, which can then calculate or determine particular parameters and display them for a user testing the DUTs.

Reducing Settling Error

As mentioned above, characterizing wide bandgap power devices causes conventional instruments to operate with a dynamic range larger than those for standard bandgap devices. Operating an instrument at high dynamic range may cause the testing instrument to be less capable of discerning small variations in some parameters being tested. The dynamic range of a measurement instrument used for testing wide bandgap power semiconductor devices may be limited by a variety of factors, such as settling error, noise, and the bit resolution of the Analog to Digital Converters (ADCs). Settling error may be the largest contributing factor to reducing the dynamic range of measurement instruments. Settling errors may be found in the input channels of an oscilloscope, and may also be found in measurement probes, and are generally related to mismatches in parallel RC divide networks in both the probes and the test channels of the instrument. Further, overdrive errors may introduce additional settling errors. In modern oscilloscopes and probes, the settling errors are generally specified at approximately ±2%, which means that the settling errors may be as high as ±4% in the combination of a probe that has a poor settling error that is coupled to a channel also having poor settling error. Measurement errors of this magnitude may cause significant deviation from actual measurements and lead to poor measurement results.

Some embodiments of the disclosure use the first pulse of a double-pulse Test (DPT) to characterize the settling error of the measurement probe and the instrument channel in the actual test environment for the DUTs being tested. Then, the settling error determined during operation of the first pulse may be compensated for, for example by being subtracted, or otherwise removed from measurements of the second, or any subsequent, pulse of the DPT to accurately measure Rds(on) without the impact of the settling error, or with significantly less effects from the settling error.

Figure 3A:
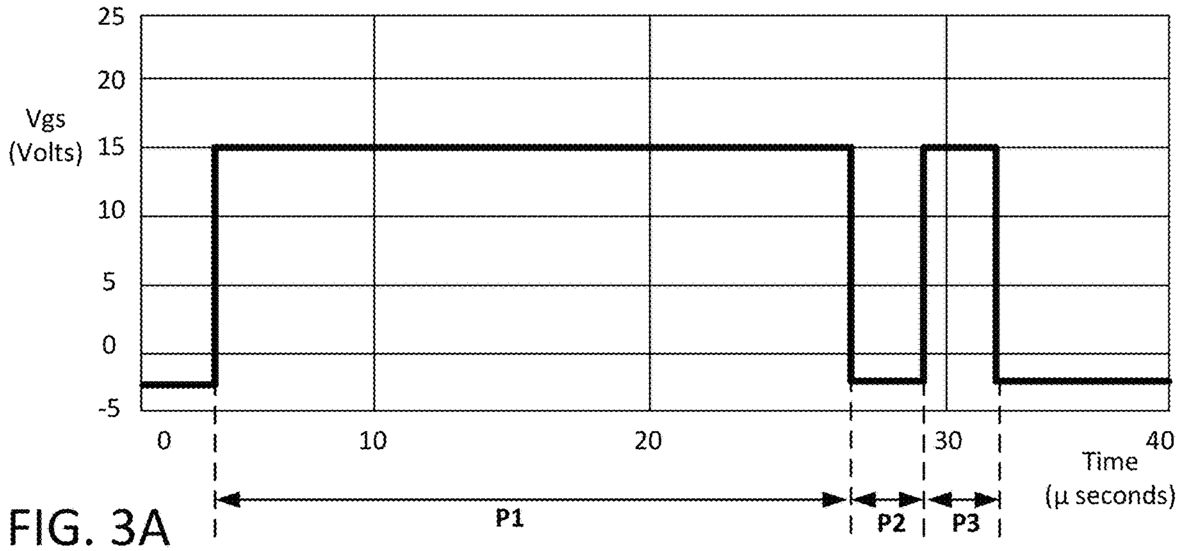
FIG. 3A is a graph illustrating conventional gate-source voltage characteristics of an ideal power device under test.
Figure 3B:
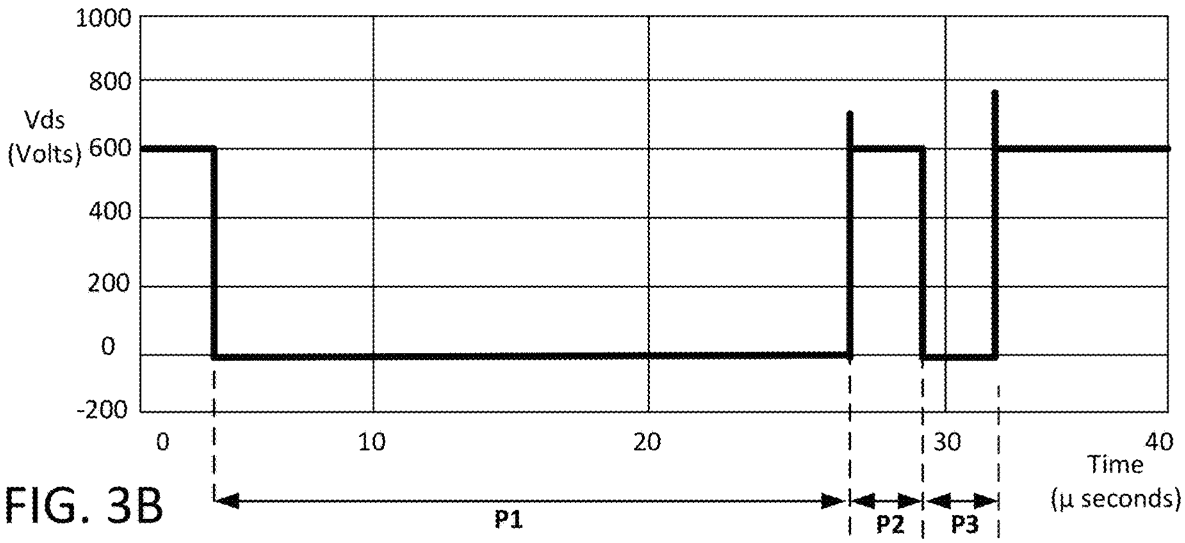
FIG. 3B is a graph illustrating conventional drain-source voltage characteristics of an ideal power device under test.
Figure 3C:
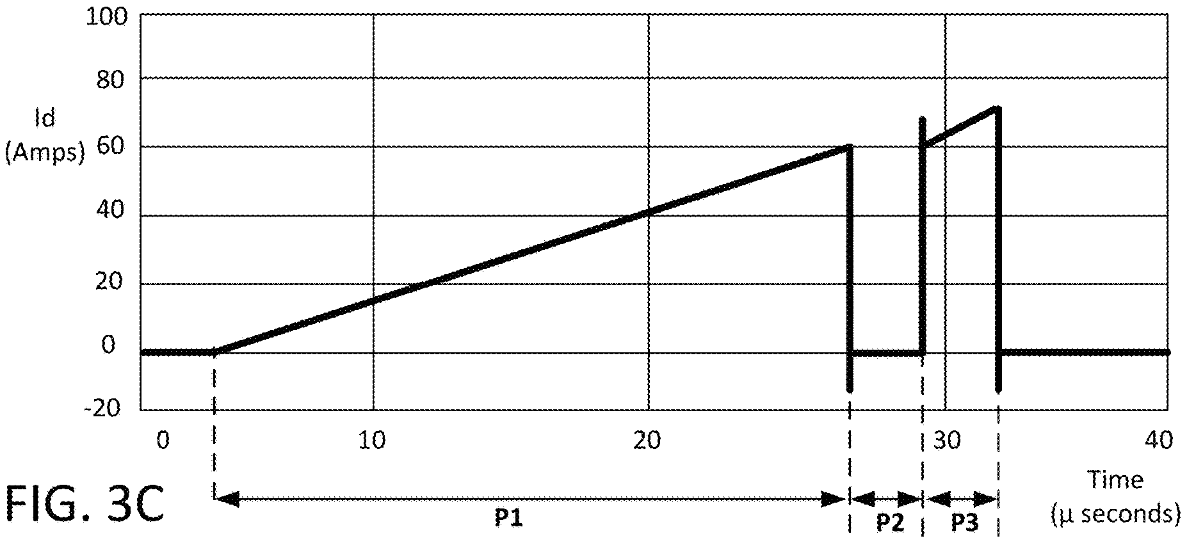
FIG. 3C is a graph illustrating conventional current drain characteristics of an ideal power device under test.

With reference to FIGS. 2, 3A, 3B, and 3C, in a conventional DPT test, the device being tested (DUT), such as the low-side device 72 (FIG. 2), is turned on during a first drive pulse. The first drive pulse may take the form as illustrated during a time period P1 in FIG. 3A, which is a graph of a gate drive voltage being applied to an example DUT. The simulated DUT measurements in FIGS. 3A, 3B, and 3C are based on an ideal semiconductor, and therefore the graphs are likewise ideal graphs, but they are similar enough to actual device operation to describe the embodiments herein. In general, two pulses are applied to the DUT, illustrated during time periods P1 and P3 in FIG. 3A. The time period P2 illustrates a time between the two pulses of the DPT. In this example, the drive voltage of approximately 15 Volts is applied to the gate of the DUT for a duration of 20-25 microseconds (μ seconds).

FIG. 3B illustrates the drain-source voltage, Vds of the DUT. At time 0, the DUT was in an OFF state, due to the gate drive voltage (illustrated in FIG. 3A) being below the turn-on voltage for the DUT. And in this testing setup, the OFF voltage between the drain and source of the DUT is approximately 600 volts. Then, at approximately 3-4μ seconds into the DPT, the pulse driving circuit causes the gate drive voltage to increase to approximately 15 Volts at the gate of the DUT, which turns on the DUT. Since the drain-source voltage across an ideal transistor that is ON is zero volts, the Vds drops from approximately 600 Volts to zero Volts at the beginning of P1, as illustrated in FIG. 3B. Turning on the DUT, for example the low-side device 72 of FIG. 2, at the beginning of P1 causes current through the load inductor 84, and thus through the DUT, to ramp linearly to some desired test current. The current flowing through the DUT is illustrated in the graph of FIG. 3C, which is time-coordinated to the graphs of FIGS. 3A and 3B. The current through the load inductor 84 continues to increase until the beginning of time period P2, when the gate driving circuit drops the voltage applied to the gate of the DUT below 0 Volts (FIG. 3A), which turns off the DUT.

During time P2, the DUT remains OFF, which causes its Vds voltage to return to approximately 600 Volts (FIG. 3B), and the current through the DUT reduces to zero as well. It is possible, during any of the pulses in the DPT, that there be an amount of overshoot in the Vds or Id, which is illustrated in FIGS. 3B and 3C.

At the beginning of the time period P3, the DUT is switched ON again by applying the second pulse to the gate (FIG. 3A). Note that the current through the DUT begins rising from approximately where it was (60 Amps) at the time the first pulse ended, i.e., at the beginning of time P2. With reference back to FIG. 2, the inductor current through the inductor 84 is maintained through a diode or the other switching device in the half-bridge circuit, such as the high-side device 74, during the OFF time of the DUT. That means that the second pulse (during time period P3) starts at essentially the same current as was flowing at the end of the first pulse, as illustrated in FIG. 3C. Measurements of the DUT or DUTs are generally made during the second or subsequent pulse of a DPT, i.e., during the time period P3, rather than during the first pulse P1, so that the switching behavior of the DUT may be measured or determined at or near the desired test current.

Note that, with reference to FIG. 3B, the step in Vds from 600V down to ~0V is essentially the same at the beginning of the time periods P1 as well as P3. Thus, the settling errors of the measurement probe (reference 24, FIG. 1) as well as the channel settling errors in the measurement instrument 40 (FIG. 1) should also be essentially the same, if the time period between the pulses of a DPT is sufficiently long to allow the measurement probe and measurement instrument to settle to the same state as they were before the first pulse of the DPT.

In general, the width of the first pulse of a DPT is chosen to ramp the inductor current, as measured by Id (FIG. 3C) to the desired test level, and the width of the second pulse is set to mimic the intended use-case pulse width, so that the DUT is tested in conditions similar to operating conditions. But the length of the time period P2, which is the time between the pulses of a DPT, does not significantly impact the DPT test, so can be set to a time period that allows embodiments of the disclosure to ensure setting of the testing system, as long as the increased time of P2 does not significantly affect the status of the DUT test. Probe and oscilloscope measurement channel time constants are typically in the range of approximately 10 μs, and five time constants is a typical waiting time to minimizing the effects of RC time constants. Therefore, a settling time of approximately 50 us settling time for the time period P2, which is the time between the first and second pulses in a DPT, should be sufficient in most cases for the measurement channel and probe to settle after measuring the first pulse of the DPT. In other embodiments, the time between the first pulse and subsequent pulses may be between 30-50 μs. In other embodiments the time period may be between 30-100 μs.

Figure 4:
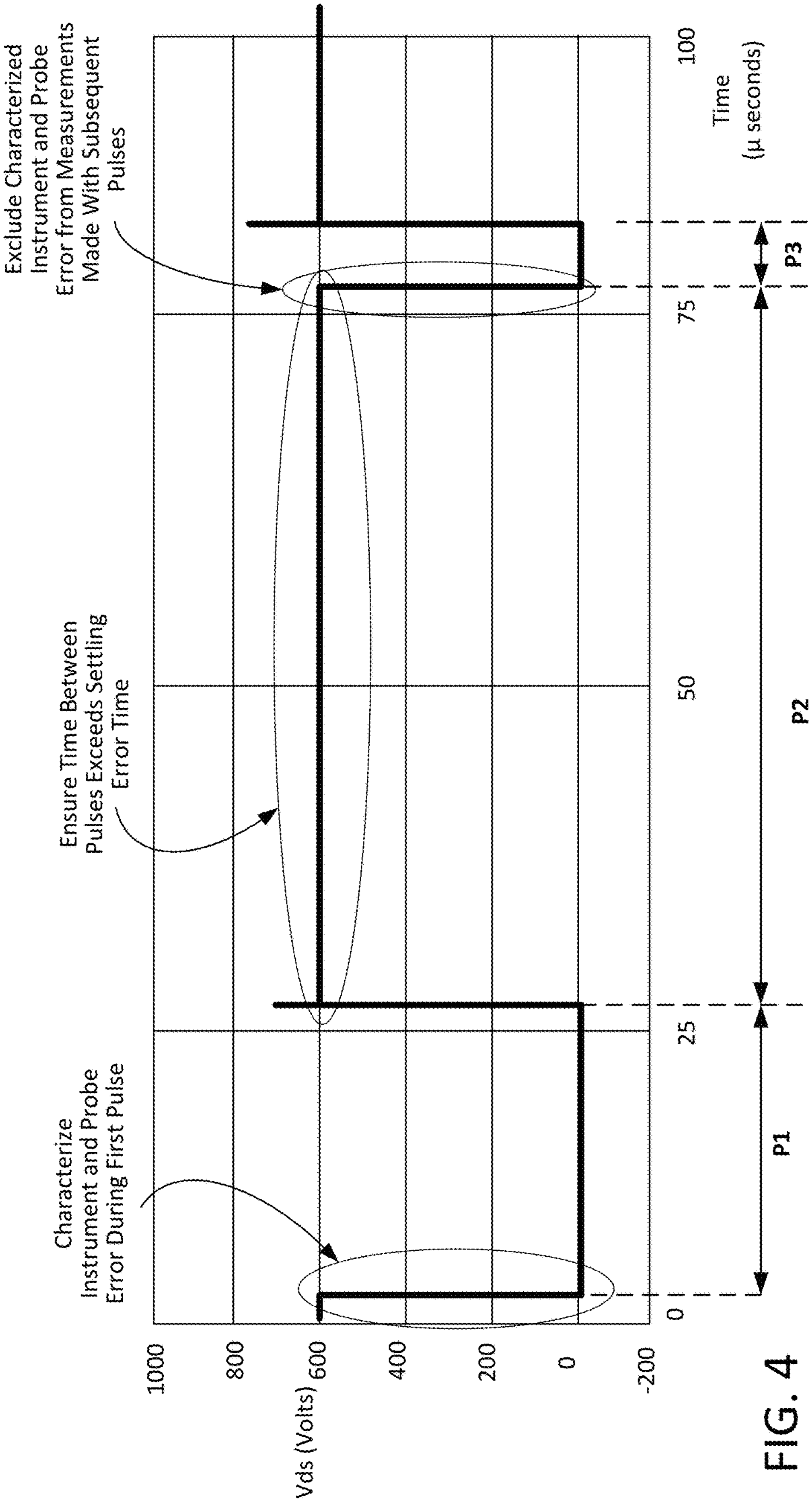
FIG. 4 is a graph illustrating methods of increasing accuracy of measurements made by a testing platform by accurately characterizing error, according to embodiments of the disclosure.

FIG. 4 is a graph that illustrates operations of embodiments according to the disclosure. The graph of FIG. 4 is similar to the graph of FIG. 3B, except that the time period P2 in FIG. 4 is much longer in comparison to the time period P2 of FIG. 3B. In embodiments, the settling error for the instrument testing channels and the probe is determined using the large voltage drop at the beginning of the time period P1. Note that this settling error is determined using the same testing channel, the same probe, the same DUT, and at the same temperature as the actual measurements will be made during the time period P3, so that it will likely match the settling error experienced during the actual measurement made during P3 very well. Then the settling error just determined in the period P1 may be removed, such as by subtraction, by the measurement instrument for the measurement itself made at the second pulse.

After removing the settling error, the dynamic Rds(on) measurement of the DUT may be calculated by the instrument as $Rds(t)=\Delta Vds(t)/\Delta Ids(t)$, where both deltas are calculated as the difference between the respective measured parameters at time t into the second pulse vs the first pulse. The measurement instrument and probe settling errors nominally cancel out from this ΔVds(t) calculation, leaving only the difference in drain-source voltage between them due to the different drain current multiplied by the dynamic Rds. Since the inductor current through the inductor 84 is essentially a ramp during both pulses of the DPT (defined by $di/dt=V/L$), the ΔIds(t) calculation is essentially constant, representing the current flow at the beginning of the second pulse.

This approach of reducing the effect of setting error in a dynamic measurement of a power device uses the first pulse of the DPT to characterize the settling error in the same configuration, environmental conditions, and only a fraction of a millisecond before measuring Vds(on) during the second pulse. Thus, the error measured at the first pulse should be much more stable than any attempt at using compensation or characterization factors that may have been provided by the manufacturer of the probe or the measurement device, which could have changed significantly since the instrument's manufacture date. In embodiments, the only added requirements to a standard DPT setup is that the time between pulses, the time period P2 in the above examples, should be set long enough for everything except the inductor current to settle to the same state before the second pulse as was present before the first pulse of the DPT. In other embodiments, multiple characterization and tests could be performed, with the results averaged to one another, which minimizes the impact of noise that may have been measured during the testing.

Minimizing Errors Due to High Dynamic Range by Clipping

In addition to settling error in the measurement instrument and measuring probe negatively affecting measurements, as described above, accurately measuring power devices may also suffer from issues stemming from the high dynamic range required to measure power devices. As described above, power devices may operate under conditions of more than one thousand volts, and testing the devices is best when tested at or near operating conditions. Therefore, measurement instruments testing power devices need to be capable of making accurate measurements in excess of one thousand volts.

Figure 5:
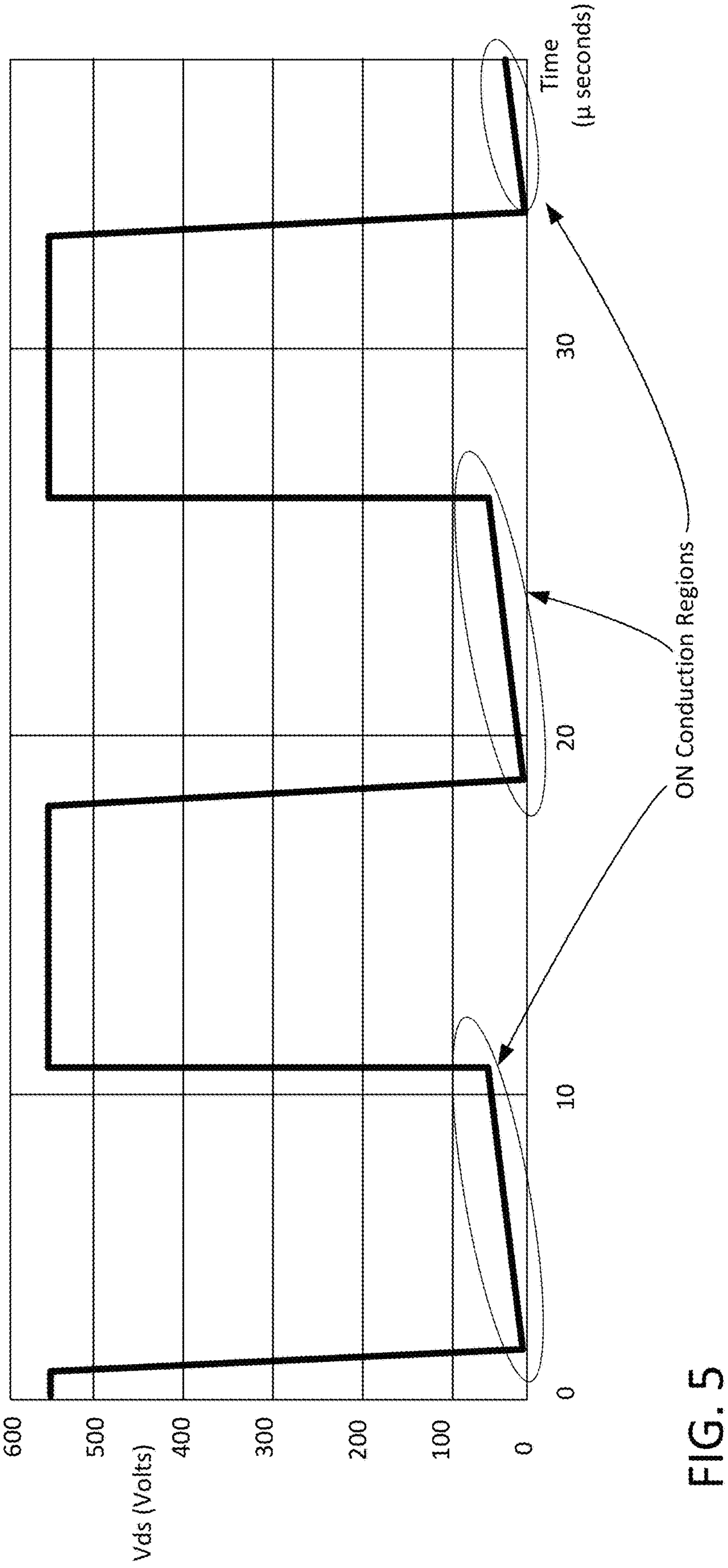
FIG. 5 is a chart illustrating example Vds voltages measured from power transistors identifying difficulties with accurately making such measurements.

When a measurement instrument inputs a signal for testing, the input signal is generally an analog signal that is digitized into a large number of digital samples by one or more Analog-to-Digital Converters (ADCs) within the measurement instrument. When an input must be measured over an entire large span of values, the ADCs are not well used as each of the individual steps in the ADC output are separated more than if the input voltage had a lower span. For example, FIG. 5 is a chart illustrating example Vds voltages measured from power transistors. The OFF voltages in this chart are approximately 550 volts, while the ON voltages, which are circled, span only a small portion, such as 30 Volts of the entire 600 Volt span. This is an example of a measurement instrument needing a high dynamic range. And the effect of having the ON voltages spanning such a small portion of the entire voltage span makes it difficult for the measurement instrument to accurately distinguish between small changes in the ON voltages, since the ADC capabilities are not well utilized.

As mentioned above, one method of dealing with these mismatches in the dynamic range is to use a hardware voltage clamp to clamp a voltage, such as the Vds voltage graphed in FIG. 5, to a much smaller value, such as 25 or 50 volts. In this way the ADCs of the measurement instrument are well utilized since the ON voltages being measured span nearly 50 percent of the entire voltage span, due to the span being limited by the hardware voltage clamp. But, also as described above, using a hardware clamp has disadvantages in that it is an extra component, needs to be engineered to match the testing environment, and adds extra expense.

Some embodiments according to the disclosure address this issue without the necessity of added hardware by modifying some of the values being measured by the instrument. More specifically, these embodiments perform a software 'clamping' action, so that any sampled value in excess of a maximum value is replaced with the maximum value. The maximum value may be chosen to ensure that the measurement instrument is set to work within a dynamic range that allows the regions of interest, such as the Vgs(on) values of a power transistor, to be accurately measured due to the lower dynamic range used to cover the operating voltages that are limited to the chosen maximum.

Various embodiments may perform this action of limiting input values to a maximum value in a number of ways. In one embodiment an automated process scans the measurement values, replacing each value that is over the maximum with the maximum value. In another embodiment, the user may use a "scaler" function of the measurement instrument to identify portions of a waveform, from which minimum and maximum voltages are determined. Then the measurement instrument adjusts the scale of the input waveform to match the size of the waveform determined using the scaler function. This embodiment works well for test patterns that tend to repeat within specified ranges. In another embodiment, the ADCs may be controlled to generate an output value at a maximum level if the input value being analyzed by the ADCs meets or exceeds the maximum level. Also, the ADCs may be set so that this "clipped" waveform, i.e., the input that has its values limited to a maximum value, is digitized at a relatively fine level, so that minute differences in the clipped waveform may be discerned. In other embodiments, or as an extension to the previously described embodiment, the measurement instrument is configured to modify the input configuration of a particular input channel based on values provided by a user, even when the actual values received on that channel may exceed the values provided by the user. For example, the user may specify that the maximum value for the waveform received at Ch 1 of an instrument will not exceed 25 Volts. In response, the instrument is configured to a scale consistent with the maximum value, such as setting the input channel at 10 Volts per division (10V/div). In actuality, the user knows that the voltage on Ch 1 will exceed 25 volts, possibly as high as 800-1000 Volts. But, by configuring the input in this manner, the ADCs will digitize the incoming samples at the fine level that was set at 10V/div. Very high voltages, for example, those exceeding 200 Volts on the channel that was configured at 10V/div, may be digitized at a maximum value of the ADCs, so that there will be very little or no distinction between, for example, a 250 Volt sample and an 800 Volt sample received at an input configured to measure at 10V/div. This is not an issue, however, if voltages less than 25 Volts are the only voltages of interest to the user. In yet other embodiments, the user may directly, manually, set the vertical scale for measurements made by the instrument for a particular channel. Any of these above embodiments, and others, may be used to cause the measurement instrument to capture or modify an input waveform to one with high fidelity in areas or portions that are important to the user.

In this disclosure, a "clipped" waveform, or similar identifier, means a waveform that has one or more portions that have higher resolution in particular regions of interest, as well as one or more portions with lower resolution in regions other than the particular regions of interest.

Figure 6A:
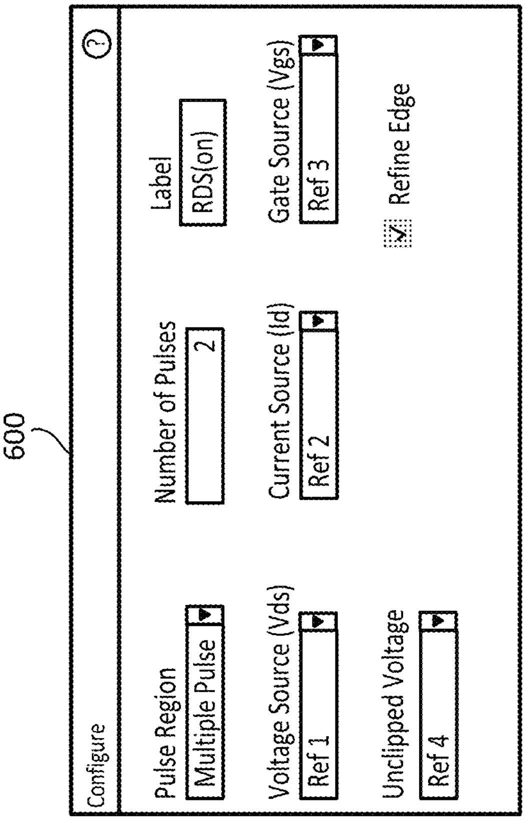
FIGS. 6A and 6B are example setup menu screens of the type present on the test and measurement instrument of FIG. 1 according to embodiments.
Figure 6B:
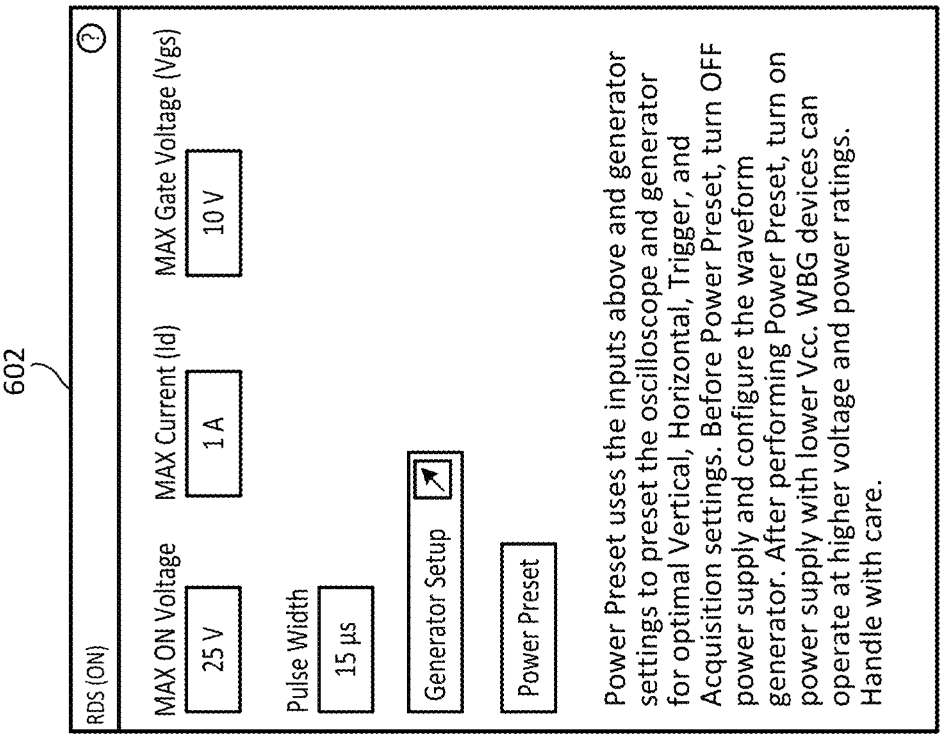

FIGS. 6A and 6B are setup screens that may be presented to a user, such as through the user interface 42 (FIG. 1), to configure the measurement instrument 40 to perform some of the clamping or clipping operations described above.

In general, the user sets up the measurement instrument with sources of the DUT or DUTs being tested. A configuration menu 600 of FIG. 6A allows the user to designate a channel or signal reference that carries the signal acquired with a high resolution, or input using any of the techniques described above. This signal reference is referred to herein as 'clipped'. In practice the signal reference specified in the configuration menu 602, such as Voltage Source (Vds), which is selected as Ref 1, means that the Reference 1 waveform from the measurement instrument 40 is coupled to measure the drain-source voltage of the DUT, such as the low-side device DUT 72 of FIG. 2. Also, an "unclipped" voltage of the same measurement may also be acquired, which in this example is acquired as Reference 4. Utilizing the "unclipped" voltage measurement is described below with reference to other embodiments according to the disclosure. The current source in the configuration menu is set to be received as Reference 2, and the gate source is set to be received as Reference 3.

A specialized menu for measuring the Rds(on) value is shown as a menu 602 in FIG. 6B. This menu 602 allows the user to specify the maximum ON voltage, which is the value to which all measured voltages exceeding this maximum are set, using the clipping process described above. Or, in other embodiments, the measurement instrument performs scaling for its input channel based on the specified maximum ON voltage. Also, maximum values for current and gate voltages may also be set in a similar manner.

Pressing the "power preset" button illustrated in the menu 602 causes the measurement instrument 40 to set the vertical and horizontal scales, as well as setting a trigger to coincide with the gate driving signal, as driving the gate of the DUT causes the DUT to turn ON, which indicates the start of the pulses in the DPT. Referring back to the menu 600 of FIG. 6A, note that there will be two versions of the Vds signal accepted by the measurement instrument. The first, labeled as Ref 1, will be the "clipped" voltage measurement, while the second, labeled as Ref 4, will be the "unclipped" voltage measurement. In practice, in some embodiments, the measurement device accepts the same signal as both Ref 1 and Ref 4, but the input channels associated with these references are set to have different measurement characteristics. Most importantly, the clipped voltage measurement is set with a much lower volts/division level than the unclipped voltage measurement, thus preserving the accuracy of the measurements made with this lower volts/division. For example, the clipped voltage measurement may be set at 10V/div, while the unclipped voltage measurement may be set at, for example, 100V/div. It is much easier to detect slight variations in voltage at 10V/div than 100V/div. The way the measurement device utilizes these measurements made with different input parameters, such as input granularity, is described in detail below.

After the input channels are configured, next the user causes the gate driver 28 (FIG. 2) to start the DPT and drive the gate of the DUT. The gate driver 28 may be caused to operate by initiating the signal generator 34. Once the gate driver 28 initiates the DPT, the measurement instrument is triggered and records all of the waveforms used to analyze the power device, such as the gate-source voltage, drain-source voltage (measured at two different input scales), and drain current waveforms as described above. In some embodiments the measurement instrument may refine the edge of the pulses in the DPT. The configuration menu 600 illustrates this function as an optional feature.

Clipping the waveform in the manner described above allows the instrument to perform a detailed analysis of the data acquired at the fine scale, while also preserving the input data from the unclipped waveform acquired at a standard scale.

Reconstructing a Waveform from Two Acquired Waveforms

Embodiments of the disclosure utilize both the clipped and unclipped waveforms to reconstruct a combined waveform that uses some components from the clipped waveform as well as other components from the unclipped waveform to make a combined waveform that has more accuracy than either of the clipped or unclipped waveforms.

Figure 7:
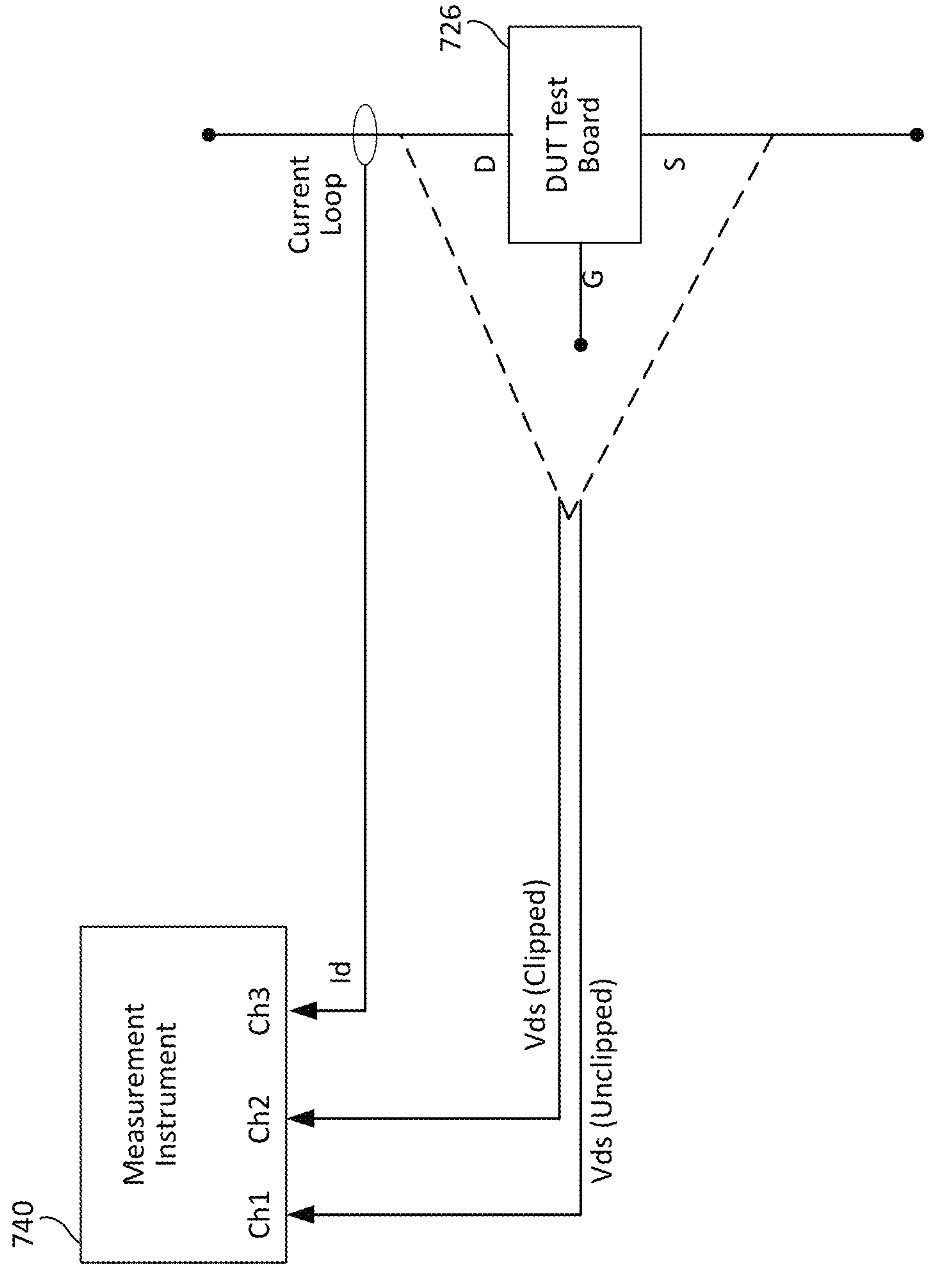
FIG. 7 is a block schematic diagram illustrating how a measurement instrument according to embodiments of the disclosure may be set up to receive testing waveforms from a DUT according to embodiments.

FIG. 7 is a high-level schematic block diagram illustrating various waveforms from a DUT test board 726 testing setup being measured by a measurement instrument 740. The measurement instrument 740 may be an example of the measurement instrument 40 (FIG. 2), and the testing setup 726 may be an example of the test board 26, or other components of the testing platform 20 (FIG. 2). The measurement instrument 740 processes the unclipped version of the Vds waveform at Ch 1 of the measurement instrument and processes the clipped version of the Vds waveform at Ch 2 of the instrument. Depending on implementation details, the clipping process may occur in several different ways. In one embodiment the Volts/division of the channels 1 and 2 are set to different values as the Vds waveform is acquired from the DUT test board 726. Also, a measurement of current flowing through the DUT is captured at Ch 3 of the measurement instrument.

Figures 8A, 8B, 8C:
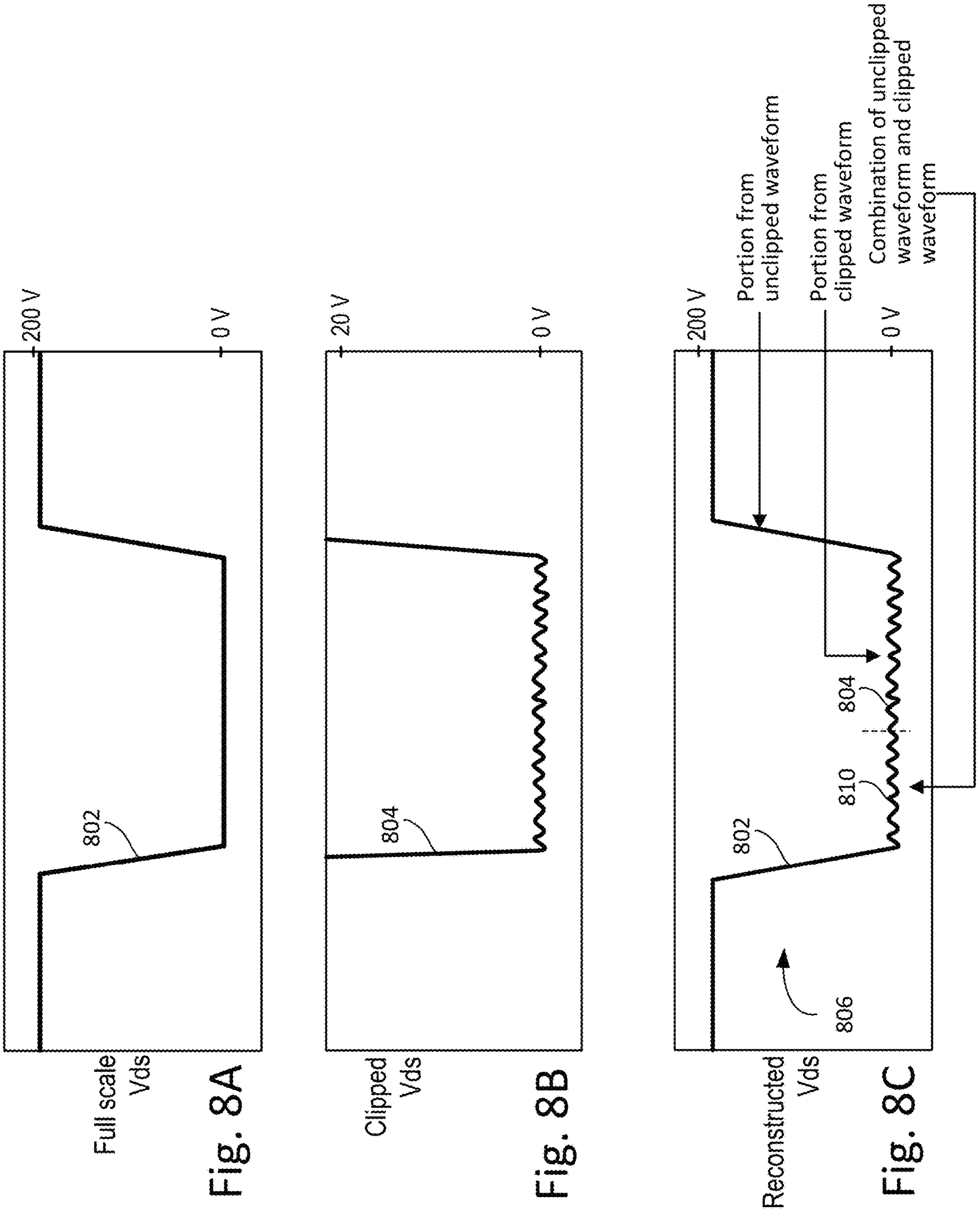
FIGS. 8A, 8B, and 8C are example graphs illustrating example waveforms that may be received by the instrument of FIG. 7, according to embodiments.

FIG. 8 graphically illustrates a very simplified version of using two different measurement waveforms to make a reconstructed waveform to explain the broad concepts of embodiments of the disclosure. The waveform illustrated in FIG. 8A represents a full-scale, or unclipped version of an idealized Vds waveform 802 of a power device measured by a measurement instrument. This waveform 802, for example, represents the unclipped Vds waveform acquired by the measurement instrument 740 on Ch 1 (FIG. 7). A waveform 804 illustrated in FIG. 8B represents a clipped version of the same waveform, which may be created using any of the techniques described above. Note how the vertical scale of the unclipped waveform 802 in FIG. 8A is approximately 200 Volts, while the clipped waveform 804 illustrated in FIG. 8B has a vertical scale of only approximately 20 Volts. Also note that areas of the waveform 804 near 0 Volts have discernable features, while those from the unclipped waveform 804 near the same area do not have discernable features. This is due to the increased resolution of the clipped waveform 804 compared to the unclipped waveform 802.

FIG. 8C represents a reconstructed, or composite, waveform 806 made from portions of each of the unclipped waveform 802 and the clipped waveform 804. There are many ways to reconstruct the waveform 806 from its clipped and unclipped components. The easiest way may be a time-based reconstruction (not illustrated), where, beginning at time 0 of the beginning of both the clipped and unclipped waveforms, data chosen from exactly one of the waveforms is selected to be in the composite waveform. For example, data from the unclipped waveform 802 could be used for the first portion of the reconstructed waveform 806 up until the time when ripples appear in the clipped waveform 804. Then data from the clipped waveform 804 is used for the middle portion of the waveform until the Vds signal begins to rise, at which point data from the unclipped waveform 802 is used again. Although this recombination system is perhaps the easiest to implement, the quality or accuracy of the reconstructed waveform 806 using this technique may suffer.

Another embodiment of generating the reconstructed waveform 806 is illustrated in FIG. 8C, where portions from the unclipped waveform 802 are used in the beginning and the end of the waveform 806. The middle portion, however, is divided into two sections. In the first section 810, the reconstructed waveform 806 is generated from a portion of both of the unclipped waveform 802 and the clipped waveform 804. In a second section of the middle portion, the clipped waveform 804 is selected for the composite, reconstructed waveform 806. Although this technique having a combination portion of both the clipped and unclipped waveforms in the first section 810 may produce better results than the time-based approach, embodiments of the disclosure use even more sophisticated techniques in reconstructing the composite waveform, which are described in detail below.

Figure 9:
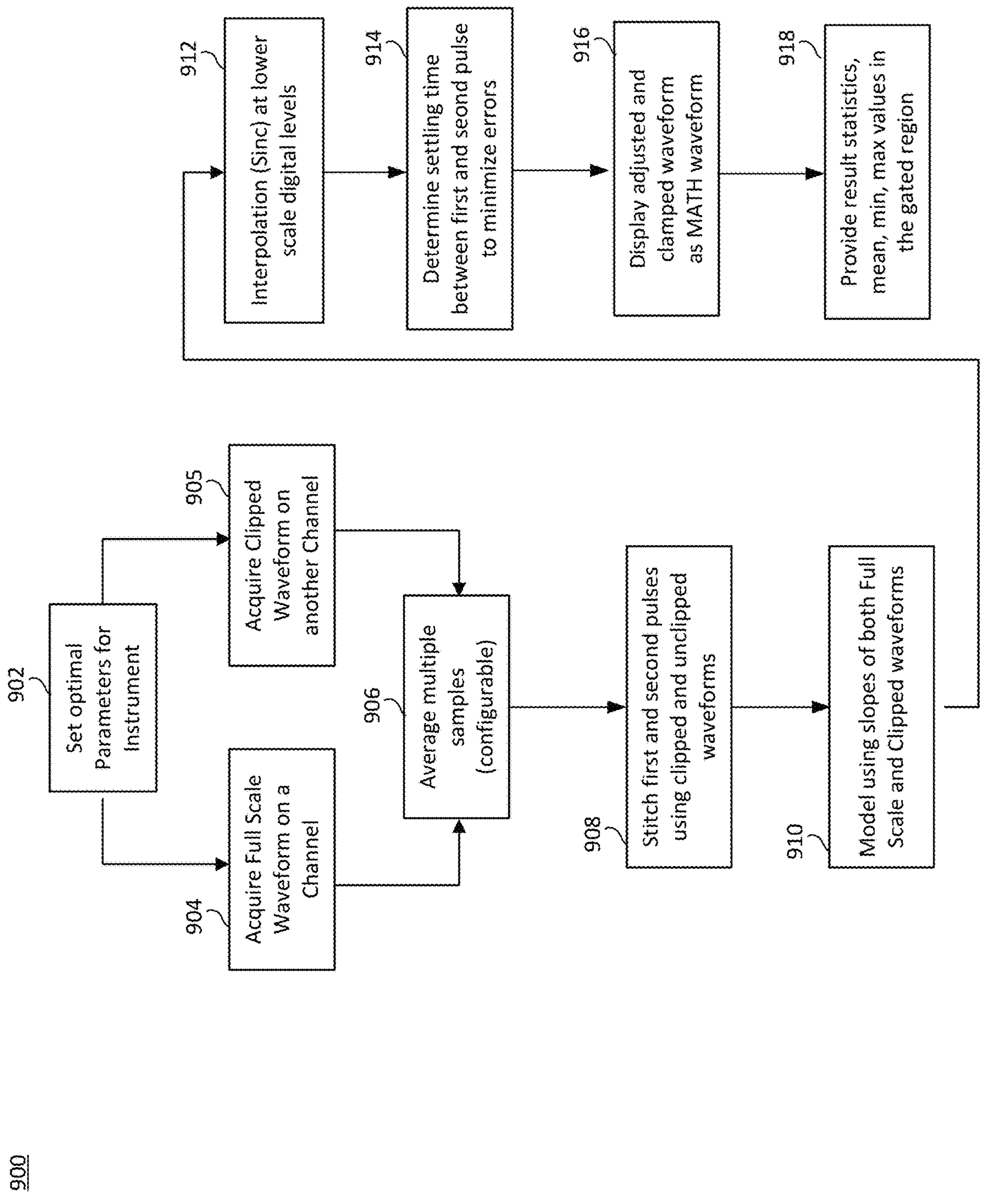
FIG. 9 is a flowchart illustrating example operations that may be used in the instrument of FIG. 7 to generate a reconstructed graph from component waveform inputs according to embodiments of the disclosure.

FIG. 9 is a flow diagram illustrating example operations of a flow 900 used to generate a waveform representing measurements from a DUT, such as a waveform representing the dynamic Rds(on) of a power device with increased accuracy of what is available in current devices. Although this embodiment is described using Vds as an input waveform and generating an Rds signal from both Vds and Id measurements, embodiments of the disclosure may use the same techniques described herein to generate and analyze composite waveforms of any type of measurable and/or calculable waveforms from any type of DUTs being measured.

The flow 900 begins at an operation 902, where optimal parameters are set for a test and measurement instrument being set up to test a DUT, such as the measurement instrument 40 (FIG. 1) being set up to test one or more DUTs 27. Such parameter settings may include setting an ADC to 12-bit mode, and setting a high-resolution acquisition mode, such as HiRes, for example. Next, in parallel operations 904 and 905, a measurement signal, such as a Vds signal from a DUT is acquired by the measurement instrument at two different resolutions, from two different input channels of the instrument. A standard version of the measurement signal is acquired at full resolution for a high dynamic range signal on one of the channels in the operation 904. The version of the input signal acquired in the operation 904 is referred to as the full scale, or unclipped, signal and is generated at the standard resolution for a high dynamic range signal. In some embodiments for power devices, the Vds acquired on this channel may exceed 600 or 800 Volts, and may be quantized at, for example, at 100V/div. At the same time, the operation 905 acquires the clipped version of the measurement signal on another channel. The clipped waveform is received or processed at a higher resolution than the unclipped waveform received on the other channel. For example, the clipped version of the input signal may be quantized at 10V/div. The higher resolution areas may be selected for particular areas of the waveform on the clipped channel, such as regions of the test when the DUT is ON. Sampling the same waveform at two different resolutions allows embodiments of the disclosure to reduce quantization noise over conventional methods. The actual quantization levels used in operations 904, 905 may be implementation specific, although generally the clipped waveform is quantized at a lower scale than the unclipped waveform. Example scale levels for the clipped waveform in operation 905 may be between 5V/div and 70V/div, preferably between 10V/ div and 50V/div, and even more preferably between approximately 10V-20V/div. The unclipped waveform may be quantized in the operation 904 at a scale of 50V/div to 200V/div, and preferably 100V/div, or another scale depending on the signal being measured.

A process 906 is a configurable process that allows the user to average one or both of the copies of the acquired signals. Averaging a number of signals received over time decreases noise that may be present in the testing setup, probe, or input channel of the measurement device. In embodiments, each of the two received signals, clipped and unclipped, are independently averaged. Averaging signals may reduce noise by up to 30-40% in some embodiments.

An operation 908 stitches both first and second pulses from a DPT together using both the clipped and unclipped versions of the input waveform obtained by the measurement instrument in operations 904 and 905. The stitching process in operation 908 may be the same or similar to the process described above with reference to FIG. 8C, where the composite waveform includes elements of both the unclipped waveform as well as the clipped waveform. In some embodiments, the unclipped waveform is used for portions of the stitched Vds waveform for periods of the DPT when the DUT is in the OFF condition, and uses the clipped waveform when the DUT is in the ON condition. Other embodiments use different methods for stitching together any combination of the clipped and unclipped versions of the waveform.

An operation 910 performs mathematical modeling of both the clipped and unclipped waveforms, including their different slopes, to generate an intermediate waveform that includes both the overall trend qualities of the full-scale waveform as well as the higher resolution scale of the clipped waveform.

An operation 912 performs a Sinc interpolation at lower scale digital levels to suppress unwanted components from the final waveform and to generate a smooth form.

An operation 914 determines how long of a settling time between the two pulses of a DPT is necessary to reduce or minimize the overdrive error, and sets the instrument to settle for that amount of time, which was described in detail above. For example, settling times between 30 μsec and 100 μsec, and more preferably around 50 μsec may be determined to be optimal time to allow settling to remove or minimize overdrive error of the measurement instrument. Performing this operation 914 minimizes potential measurement aberrations, settling errors, and deterministic errors that may occur without sufficient setting time.

Next, an operation 916 finalizes and displays a new waveform, such as a Vds waveform, for the portions of the test system when the DUT is in an ON state. In some embodiments the waveform is generated by using a Math function of the measuring instrument. A specific example of reconstructing the new waveform is explained below with reference to FIG. 10.

After the Vds(on) waveform is finalized in the operation 916, it may be used to compute an Rds(on) waveform by dividing the new Vds(on) waveform finalized in the operation 916 by the drain current of the DUT using the following equations:

$$RDS(on)(i) = \frac{\text{NEW\_Vds}(i)}{Id(i)} \qquad \text{Equation (1)}$$

where i is the sample index, i=0 to end of ON region.

In some instances, it may be easier to describe Rds(on) as:

$$RDS(on) = \frac{\text{abs(Gated for region (Clamped } VdsON\,(i) \text{ region)}}{\text{Drain Current } (i)))} \qquad \text{Equation (2)}$$

After the new waveform is displayed on, for example a display screen of the measurement instrument, an operation 918 causes the measurement instrument to scan the Rds(on) waveform generated by the operations described above to select features from the waveform, such as minimum, maximum, and other values of interest. These selected features may be populated in a badge or otherwise presented to the user of the measurement instrument to facilitate the particular test being run on the DUT.

Figure 10:
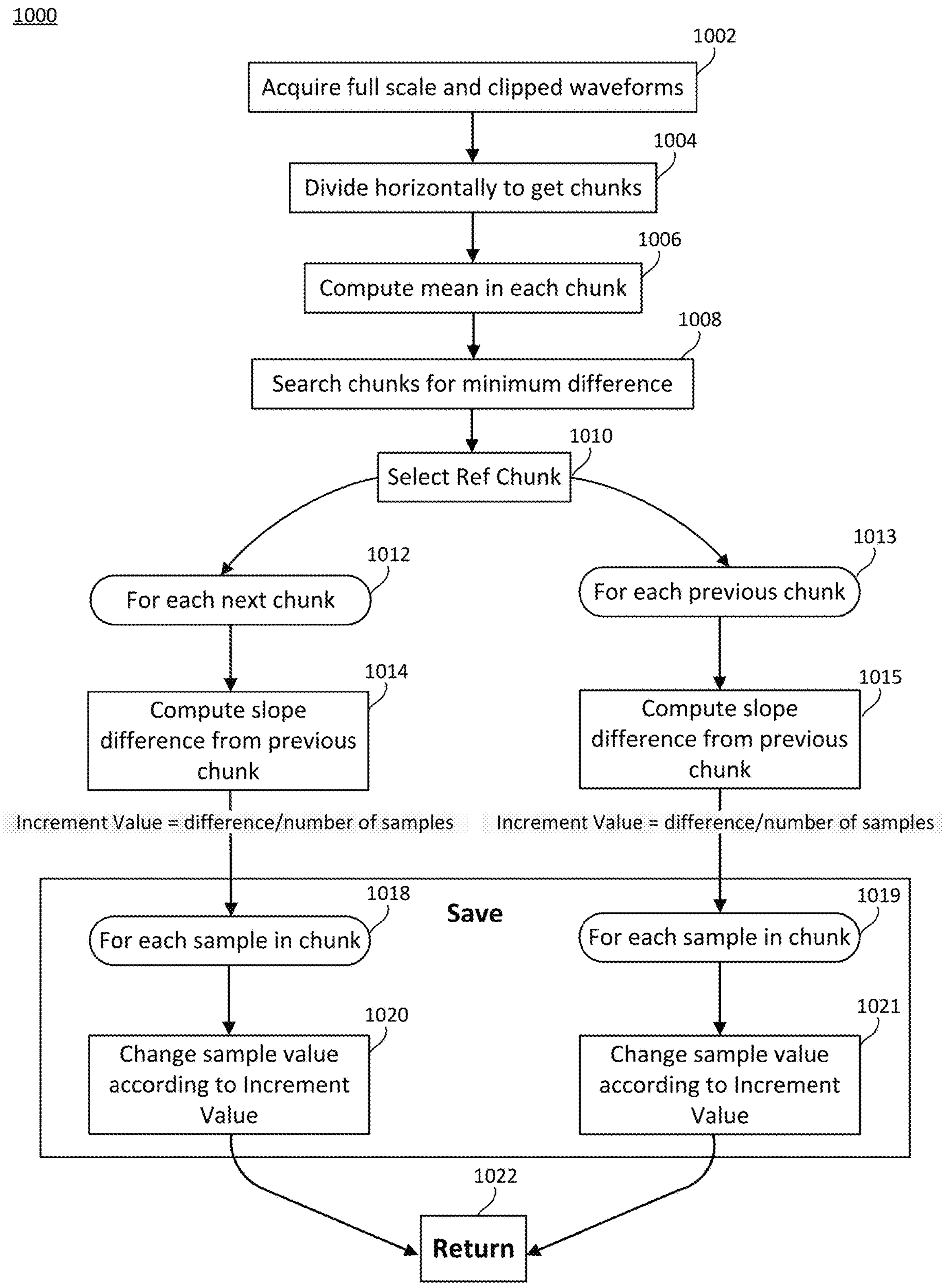
FIG. 10 is a flowchart illustrating example operations of one embodiment that may be used in the instrument of FIG. 7 for generating a reconstructed graph from component waveform inputs according to embodiments of the disclosure.

FIG. 10 is a flow diagram illustrating example operations of a flow 1000 used to create the new Vds(on) waveform that is a composite of both the clipped and the unclipped Vds waveforms described above. The flow 100 of FIG. 10 is also described with reference to FIG. 11, which is an output display of a composite waveform generated from both the clipped and the unclipped Vds waveforms received by the measurement instrument.

Figure 11:
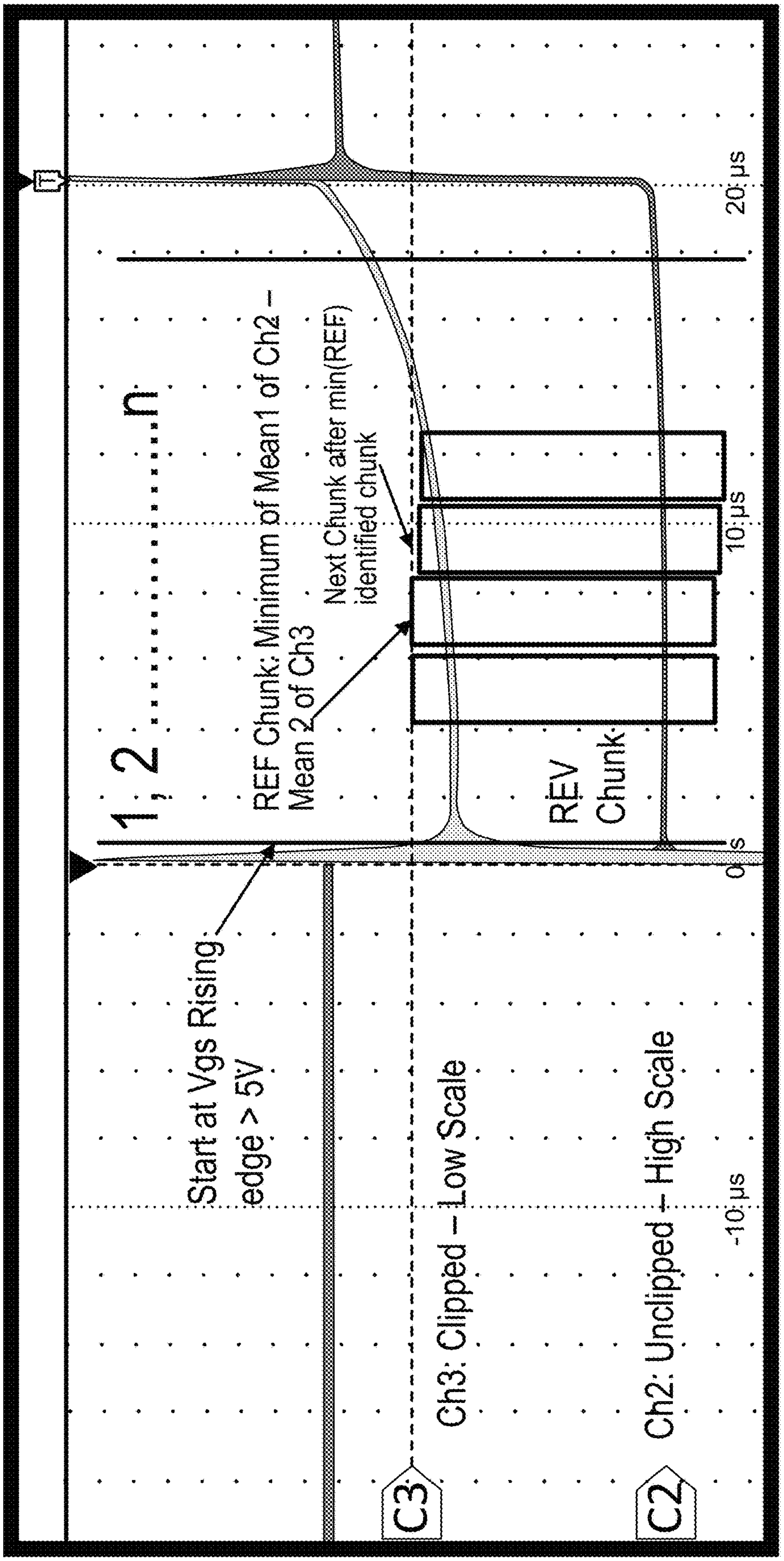
FIG. 11 is an output screen illustrating operations used to generate a reconstructed graph from component waveform inputs according to embodiments of the disclosure.

The flow 1000 begins at an operation 1002 where the measurement instrument acquires both the clipped and unclipped waveforms, as described above with reference to the flow 900 of FIG. 9. Then, the ON portion of each waveform is divided horizontally, i.e., in time slices, also referred to as chunks, in an operation 1004. Then the mean value of each chunk is determined in an operation 1006. These functions are illustrated in FIG. 11, where the waveform labeled Ch 2 is the unclipped waveform and the waveform labeled Ch 3 is the clipped, or low-scale waveform. As described above, the ON portion of the waveform describes when the DUT is turned ON, which is caused by a Vgs voltage, illustrated in FIG. 11 as occurring at approximately 1 μs.

Returning back to FIG. 10, an operation 1008 searches the chunks for those having minimum differences, and, in an operation 1010, the chuck that has a minimum mean difference is selected as the Reference (Ref) chunk in the set of chunks.

At this point, the flow 1000 begins working outward from the Reference chunk, with the operation 1012 being performed on the next chunk after the Reference chunk, and the operation 1013 being performed on the next chunk previous to the Reference chunk.

Operations 1014 and 1015 then compute a slope difference between each of the present chunks, i.e., in each direction from the Reference chunk, and the chunks adjacent thereto. Then operations 1016 and 1017 generate an increment value according to Equation 3:

$$\text{Increment value } (n) = \text{Current Chunk Mean difference } (n) - \text{Previous Chunk Mean difference } (n),$$
$$\text{for}$$
$$n = Ref \text{ Chunk} + 1 \text{ to number chunks}$$

Then, each sample value in each of the present chunks, both before and after the Reference chunk, is updated according to the increment value in operations 1018, 1019, 1020, and 1021.

The flow concludes at operation 1022, after each of the values in each of the chunks has been updated according to the flow 1000 described above. The end result is a composite waveform for Vds(on) that takes into account both the clipped and unclipped waveforms and generates a Vds(on) waveform that accurately represents the measurements from the DUT. Compared to conventional techniques of measuring a Vds(on) signal from conventional instruments, embodiments according to the above disclosure are able to more accurately determine the actual Vds(on) and Id signals, and therefore are able to compute and present to the user an Rds(on) signal that accurately describes the operation of the DUT.

Figure 12:
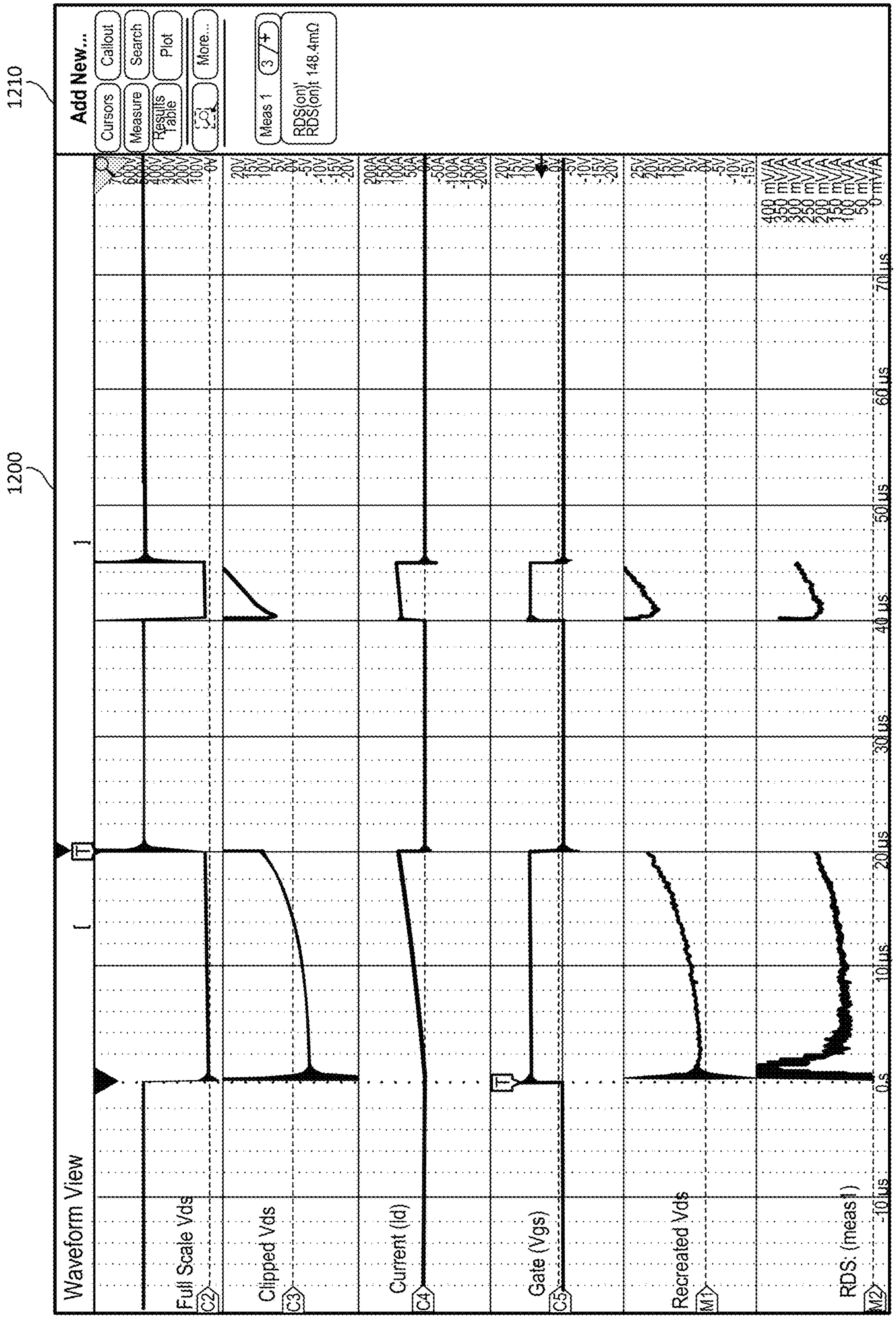
FIG. 12 is an output screen illustrating example outputs of the measurement instrument of FIG. 7 according to embodiments.

FIG. 12 is an output screen 1200 illustrating example outputs of the measurement instrument according to embodiments. The output screen presents six various waveforms, related to the same time periods, to the user to provide the measurements of the DUT being tested. As mentioned above, embodiments of the disclosure are particularly well suited for measurements of power devices, as these devices perform over extremely broad operating ranges.

In this example output screen 1200, the top waveform labeled Ch 2 is that of the full-scale, or unclipped Vds, while the waveform labeled Ch 3 shows the clipped Vds signal. Note the difference between the clipped and unclipped waveforms that the different processing by the measurement instrument caused. The clipped Vds signal Ch 3 has much more resolution than does the unclipped signal.

The current through the DUT is illustrated as the waveform labeled Ch 4, and the gate signal applied to the gate of the DUT is labeled as Ch 5. Note that the sharp rise in the gate signal coincides with the clipped Vds signal, indicating that the DUT turned on at that precise moment in time.

The waveform labeled M1 is the recreated or reconstructed Vds signal described with reference to FIGS. 10 and 11. And finally, the waveform labeled M2 is the Rds waveform, which is generated using Equation 1 set forth above.

A user-interface section 1210 of the output screen 1200 provides the user with an ability to inspect, modify, interpret, interact with, and/or perform more functions regarding the testing of the DUT. Also, a badge indicating the results of the test is also illustrated in the user-interface section 1210.

Using the techniques described above, users may generate accurate measurements when testing qualities of power devices made from wide bandgap materials.

Aspects of the disclosure may operate on particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid-state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a test and measurement system, including a device under test (DUT) interface structured to couple to at least one DUT, and a measurement instrument coupled to the interface and including one or more processors configured to execute code that causes the one or more processors, when performing a double-pulse test on the DUT, to: characterize settling error during a first pulse of the double-pulse test; and compensate the settling error characterized during the first pulse of the double-pulse test from measurements made during a second or subsequent pulse of the double-pulse test.

Example 2 is a test and measurement system according to Example 1, wherein the code that causes the one or more processors to compensate the settling error further comprises code that causes the one or more processors to determine a change in a voltage measured during the first pulse and during the second or subsequent pulse, and to determine a change in a current measured during the first pulse and during the second or subsequent pulse.

Example 3 is a test and measurement system according to Example 2, wherein the one or more processors are further configured to execute code that causes the one or more processors to determine a dynamic resistance measurement of the DUT by dividing the change in the voltage by the change in the current.

Example 4 is a test and measurement system according to any of the preceding Examples, in which the first and second pulses of the double-pulse test are separated by a time period determined by a settling time period.

Example 5 is a test and measurement including a device under test (DUT) interface structured to couple to at least one DUT and a measurement instrument coupled to the interface and including one or more processors configured to execute code that causes the one or more processors, when testing the DUT, to: accept a measurement signal at a first input channel and generate a first sample waveform from the measurement signal using a first set of parameters; accept the measurement signal at a second input channel and generate a second sample from the measurement signal using a second set of parameters; and generate a measurement waveform from a combination of the first sample waveform and the second sample waveform.

Example 6 is a test and measurement system according to Example 5, in which the first and second set of parameters are signal quantization parameters.

Example 7 is a test and measurement system according to Example 6, in which the first set of quantization parameters is selected to capture an entire dynamic range of the measurement signal.

Example 8 is a test and measurement system according to Example 7, in which the second set of quantization parameters is selected to capture only a portion of the dynamic range of the measurement signal.

Example 9 is a test and measurement system according to Example 8, in which the portion of the dynamic range is user selected.

Example 10 is a test and measurement system according to Example 8, in which the portion of the dynamic range is determined by the measurement instrument from user inputs.

Example 11 is a test and measurement system according to any of the preceding Examples 5 through 10, in which the one or more processors are configured to generate a measurement waveform from a combination of the first sample waveform and the second sample waveform by generating separate weighting factors for each of the first and second sample waveforms, and then combining the first sample waveform and the second sample waveform according to the separate weighting factors.

Example 12 is a test and measurement system according to any of the preceding Examples 5 through 11, in which the one or more processors are configured to generate a measurement waveform from a combination of the first sample waveform and the second sample waveform by: computing an increment value; and applying the increment value to a set of sample values determined to be a reference set of values.

Example 13 is a method in a test and measurement system, including providing a device under test (DUT) interface structured to couple to at least one DUT; and, in a measurement instrument coupled to the interface, characterizing settling error during a first pulse of a double-pulse test performed on the DUT, and compensating the settling error characterized during the first pulse of the double-pulse test from measurements made during a second or subsequent pulse of the double-pulse test.

Example 14 is a test and measurement system according to Example 13, wherein compensating the settling error comprises determining a change in a voltage measured during the first pulse and during the second or subsequent pulse, and to determine a change in a current measured during the first pulse and during the second or subsequent pulse.

Example 15 is a test and measurement system according to Example 14, further comprising determining a dynamic resistance measurement of the DUT by dividing the change in voltage by the change in current.

Example 16 is a test and measurement system according to any of the preceding Examples 13-15, further comprising initiating the second pulse of the double-pulse test a time period after the first pulse of the double-pulse test that is determined by a settling time period.

Example 17 is a method in a test and measurement system, including providing a device under test (DUT) interface structured to couple to at least one DUT; and, in a measurement instrument coupled to the interface: accepting a measurement signal at a first input channel and generating a first sample waveform from the measurement signal using a first set of parameters; accepting the measurement signal at a second input channel and generating a second sample waveform from the measurement signal using a second set of parameters; and generating a measurement waveform from a combination of the first sample waveform and the second sample waveform.

Example 18 is a method according to Example 17, in which the first and second set of parameters are signal quantization parameters.

Example 19 is a method according to Example 18, in which the first set of quantization parameters is selected to capture an entire dynamic range of the measurement signal.

Example 20 is a method according to Example 19, in which the second set of quantization parameters is selected to capture only a portion of the dynamic range of the measurement signal.

Example 21 is a method according to Example 20, in which the portion of the dynamic range is user selected.

Example 22 is a method according to Example 20, in which the portion of the dynamic range is determined by the measurement instrument from user inputs.

Example 23 is a method according to any of the preceding Example methods 17-22, in which generating a measurement waveform from a combination of the first sample waveform and the second sample waveform comprises generating separate weighting factors for each of the first and second sample waveforms and combining the first sample waveform and the second sample waveform according to the separate weighting factors.

Example 24 is a method according to any of the preceding Example methods 17-23, in which generating a measurement waveform from a combination of the first sample waveform and the second sample waveform comprises computing an increment value and applying the increment value to a set of sample values determined to be a reference set of values.

The foregoing description has been set forth merely to illustrate example embodiments of present disclosure and is not intended to be limiting. Since modifications of the disclosed embodiments incorporating the substance of the invention may occur to person skilled in the art, the invention should be construed to include everything within the scope of the invention.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that all features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

The invention claimed is:

1. A test and measurement system, comprising:

a device under test (DUT) interface structured to couple to at least one DUT; and a measurement instrument coupled to the interface and including one or more processors configured to execute code that causes the one or more processors, when performing a double-pulse test on the DUT, to:

characterize settling error during a first pulse of the double-pulse test; and compensate the settling error characterized during the first pulse of the double-pulse test from measurements made during a second or subsequent pulse of the double-pulse test, wherein the code that causes the one or more processors to compensate the settling error further comprises code that causes the one or more processors to determine a change in a voltage measured during the first pulse and during the second or subsequent pulse, and to determine a change in a current measured during the first pulse and during the second or subsequent pulse.

2. The test and measurement system according to claim 1, wherein the one or more processors are further configured to execute code that causes the one or more processors to determine a dynamic resistance measurement of the DUT by dividing the change in the voltage by the change in the current.

3. The test and measurement system according to claim 1, in which the first and second pulses of the double-pulse test are separated by a time period determined by a settling time period.

4. A method in a test and measurement system, comprising:

providing a device under test (DUT) interface structured to couple to at least one DUT; and, in a measurement instrument coupled to the interface:

characterizing settling error during a first pulse of a double-pulse test performed on the DUT; and compensating the settling error characterized during the first pulse of the double-pulse test from measurements made during a second or subsequent pulse of the double-pulse test, wherein compensating the settling error comprises determining a change in a voltage measured during the first pulse and during the second or subsequent pulse, and to determine a change in a current measured during the first pulse and during the second or subsequent pulse.

5. The method according to claim 4, further comprising determining a dynamic resistance measurement of the DUT by dividing the change in voltage by the change in current.

6. The method according to claim 4, further comprising initiating the second pulse of the double-pulse test a time period after the first pulse of the double-pulse test that is determined by a settling time period.

* * * * *